(12) United States Patent
Nowok et al.

(10) Patent No.: US 7,002,357 B2
(45) Date of Patent: Feb. 21, 2006

(54) METHOD AND APPARATUS FOR PHASE CALCULATION FROM ATTENUATION VALUES USING A HILBERT TRANSFORM FOR FDR MEASUREMENTS

(75) Inventors: Gregor Nowok, Nuremberg (DE); Peter Pospiech, Eggolsheim (DE)

(73) Assignee: T-Mobile Deutschland GmbH, Bonn (DE)

( * ) Notice: Subject to any disclaimer, the term of this patent is extended or adjusted under 35 U.S.C. 154(b) by 0 days.

(21) Appl. No.: 10/490,751

(22) PCT Filed: Oct. 30, 2002

(86) PCT No.: PCT/DE02/04042

§ 371 (c)(1),
(2), (4) Date: Mar. 25, 2004

(87) PCT Pub. No.: WO03/038455

PCT Pub. Date: May 8, 2003

(65) Prior Publication Data

US 2004/0251911 A1    Dec. 16, 2004

(30) Foreign Application Priority Data

Oct. 30, 2001  (DE) ................. 101 53 090
Dec. 13, 2001  (DE) ................. 101 61 399

(51) Int. Cl.
  *G01R 27/28*  (2006.01)

(52) U.S. Cl. ............... 324/616; 324/615; 324/617
(58) Field of Classification Search ........ 324/615–617, 324/533–534, 639–644, 646
See application file for complete search history.

(56) References Cited

U.S. PATENT DOCUMENTS

| 4,229,626 | A | * | 10/1980 | Peoples ............... 324/605 |
| 5,705,984 | A | * | 1/1998 | Wilson ............... 340/561 |
| 5,937,006 | A | * | 8/1999 | Clark et al. ............ 375/224 |
| 5,994,905 | A | * | 11/1999 | Franchville ........... 324/533 |

* cited by examiner

*Primary Examiner*—Anjan Deb
*Assistant Examiner*—Marina Kramskaya
(74) *Attorney, Agent, or Firm*—Cooper & Dunham LLP

(57) ABSTRACT

The invention concerns a method and a device for phase calculation from attenuation values using a Hilbert transform for reflectometric measurements in the frequency domain. The invention is characterized in that the measuring system comprises a signal source for a measurement signal, a coupling element connected to the signal source, and an object to be measured connected to the coupling element. The part of the measurement signal reflected by the object to be measured is uncoupled via the coupling element and measured at a collector. The invention is further characterized in that an attenuator is mounted in the signal path, between the coupling element and the object to be measured. The attenuator can also be comprised in the coupling element.

4 Claims, 4 Drawing Sheets

METHOD AND APPARATUS FOR PHASE CALCULATION FROM ATTENUATION VALUES USING A HILBERT TRANSFORM FOR FDR MEASUREMENTS

CROSS-REFERENCE TO RELATED APPLICATION

Not Applicable

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC OF REFERENCE TO A MICROFICHE APPENDIX

Not Applicable

BACKGROUND OF THE INVENTION

1. Field of the Invention

The invention relates to the field of so-called FDR measurement (frequency domain reflectometry) and relates in particular to a method and an apparatus for phase calculation from attenuation values by means of a Hilbert transform for FDR measurements.

2. Description of the Related Art

FDR measurements are carried out using network analyzers, which can determine the magnitude and phase of the reflection factor, or by means of spectrum analyzers, which can measure only the magnitude of the reflection factor. In present-day measurement methods, the phase is calculated by means of a Hilbert transform using spectrum analyzers with a tracking generator. One important factor for the numerical quality of the Hilbert transform is the fact that all the pole points in the logarithmic attenuation function are located as far as possible to the left of the imaginary axis in the pole null point diagrams. In currently existing measurement systems, this is achieved by means of fully symmetrical parallel branching in the measurement circuit, which is produced by the use of a coupling element (coupler). However, couplers such as these have a very high intrinsic reflection factor with respect to the measurement object and a low insertion loss from the source to the measurement object and back again from the measurement object to the power meter. This circuit ensures only the preconditions for carrying out the Hilbert transform, that is to say all the poles in the attenuation function are located in the left-hand complex half-plane. Nevertheless, undesirable and relatively large errors generally occur in the calculation of the phase.

BRIEF SUMMARY OF THE INVENTION

The object of the invention is to specify a method by means of which the accuracy of the phase calculation from attenuation values by means of a Hilbert transform is improved. A further aim is likewise to specify an apparatus for carrying out the method.

According to the invention, the object is achieved by the features specified in the independent patent claims.

Advantageous refinements and developments of the invention are the subject matter of the dependent patent claims.

According to the invention, the coupler is designed such that it has a high insertion loss between the source and the measurement object, and between the measurement object and the sink. In consequence, the poles of the attenuation function are shifted further into the left-hand complex half-plane of the pole null point diagram, and this results in a qualitative improvement in the phase calculation. The same effect is achieved by inserting the attenuation element between the coupler and the measurement object.

BRIEF DESCRIPTION OF THE SEVERAL VIEWS OF THE DRAWINGS

The following text describes an exemplary embodiment of the invention with reference to the drawings. Further features, advantages and fields of application for the invention will become evident from the drawings and their description.

In the figures.

DETAILED DESCRIPTION OF THE INVENTION

First of all, the system function is specified from the circuitry of the measurement system with the attenuation element. This is then specialized to the case without an attenuation element, and the corresponding phase (Hilbert transform of the attenuation) and the discrepancies between it and the original phase are stated for both cases.

Figure 1:
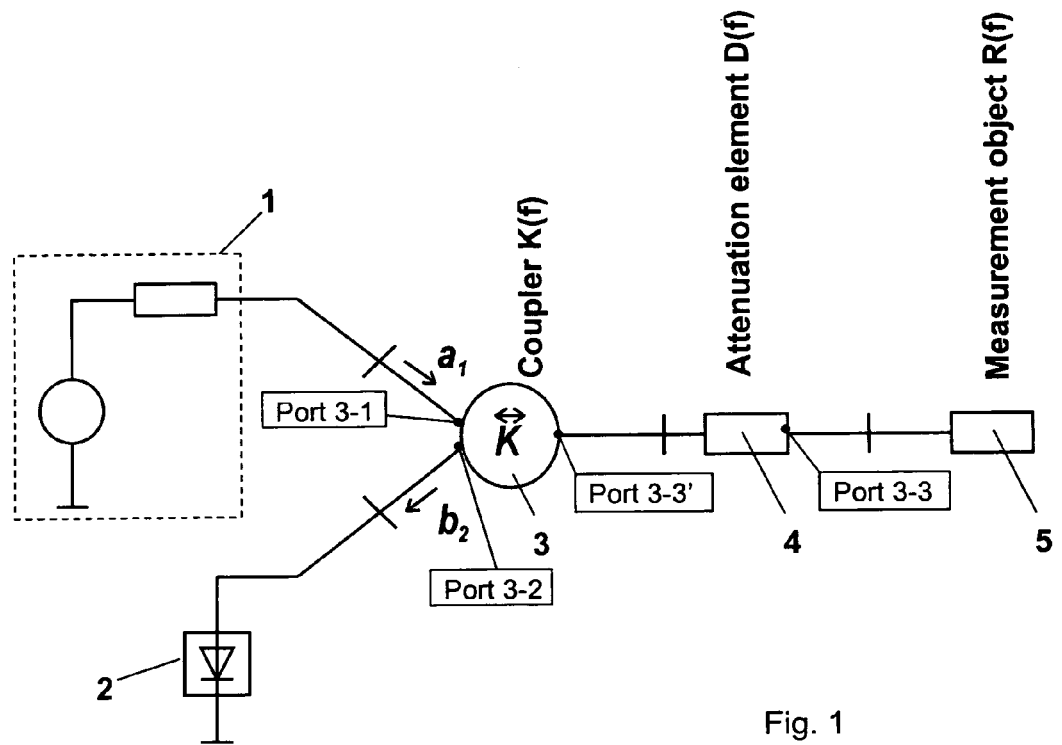
FIG. 1 shows a block diagram of the measurement arrangement according to the invention.

FIG. 1 shows the block diagram of the measurement arrangement. A measurement signal, $a_1$, is sent from a signal source 1 via a coupler 3 (input at port 3-1 and output at port 3-3') and an attenuation element 4 to a measurement object 5 (via port 3-3). The proportion of the measurement signal which is reflected in the measurement object is output in the coupler 3 and is passes to the sink 2 (receiver) (via port 3-2). The power wave $b_2$ which is passed to the receiver 2, that is to say which is reflected by the measurement object 5, is measured.

Figure 8:
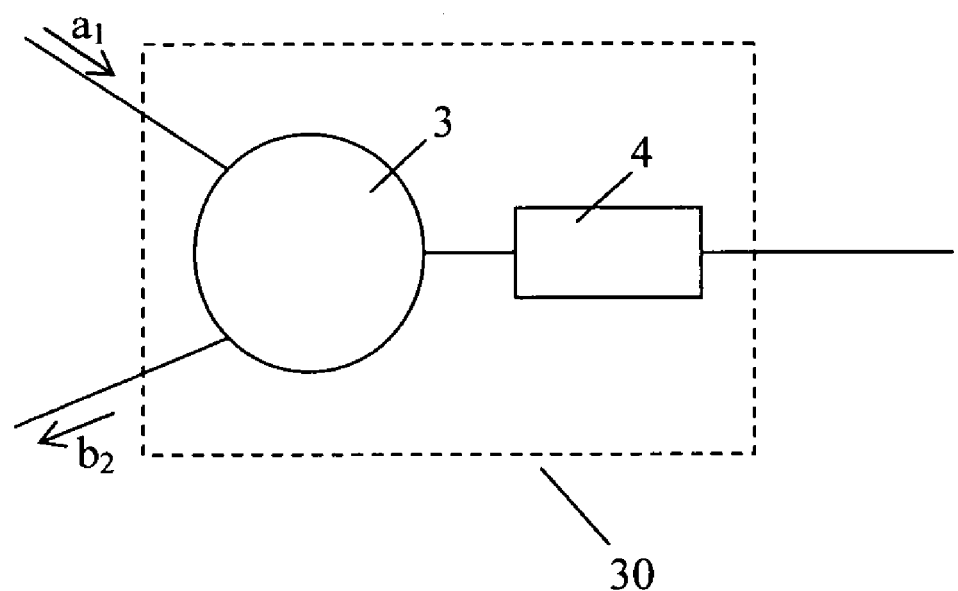
FIG. 8 shows a block diagram of a coupler and attenuator arrangement according to an embodiment of the present disclosure.

FIG. 8 shows a diagram of the coupler and attenuator of FIG. 1 according to another embodiment of the present disclosure. Here, a coupling element 30 comprises a coupler 3 and an attenuation element 4.

The associated system function for the circuitry with the attenuation element 4 at the port 3-3 is:

$$b_2 = \left[ K_{21} + \frac{K_{23} \cdot K_{31} \cdot \left( D_{11} + \frac{D_{12} \cdot D_{21} \cdot R}{1 - D_{22} \cdot R} \right)}{1 - K_{33} \cdot \left( D_{11} + \frac{D_{12} \cdot D_{21} \cdot R}{1 - D_{22} \cdot R} \right)} \right] \cdot a_1,$$

with the following matrices:

$$\overline{K} = \begin{pmatrix} K_{11} & K_{12} & K_{13} \\ K_{21} & K_{22} & K_{23} \\ K_{31} & K_{32} & K_{33} \end{pmatrix} \text{ and } \overline{D} = \begin{pmatrix} D_{11} & D_{12} \\ D_{21} & D_{22} \end{pmatrix}.$$

If the attenuation element 4 is removed, then $D_{11}=D_{22}=0$ and $D_{12}=D_{21}=1$ and the above system function is simplified to:

$$b_2 = \left[ K_{21} + \frac{K_{23} \cdot K_{31} \cdot R}{1 - K_{33} \cdot R} \right] \cdot a_1$$

R is now located at the port 3-3'.

The phase is calculated from the magnitude of the power values by means of a Hilbert transform, which is itself carried out numerically by rapid convolution:

$$\Phi_2 = FFT \left\{ FFT^{-1}[-1 \cdot \ln|b_2|(f)] \cdot \frac{1}{2} \cdot \text{sign}(r) \right\}$$

Figure 2:
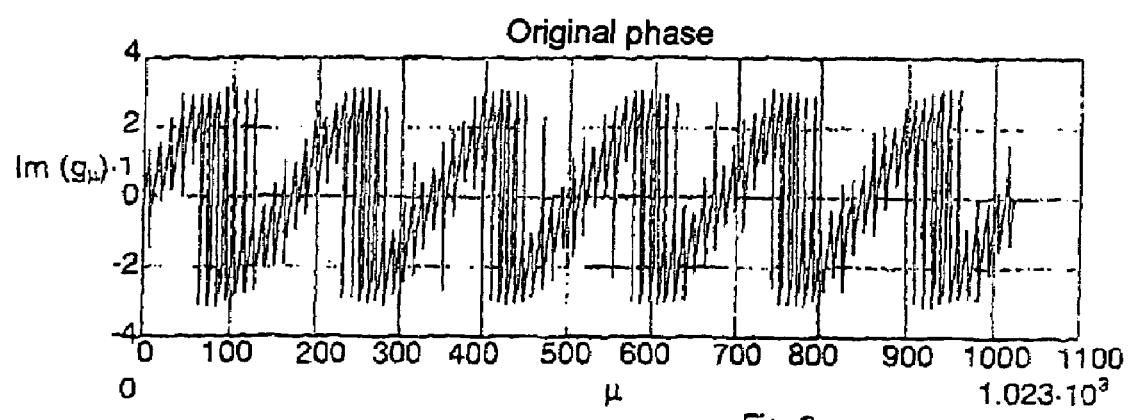
FIG. 2 shows an illustration of a measured phase profile without an attenuation element.
Figure 3:
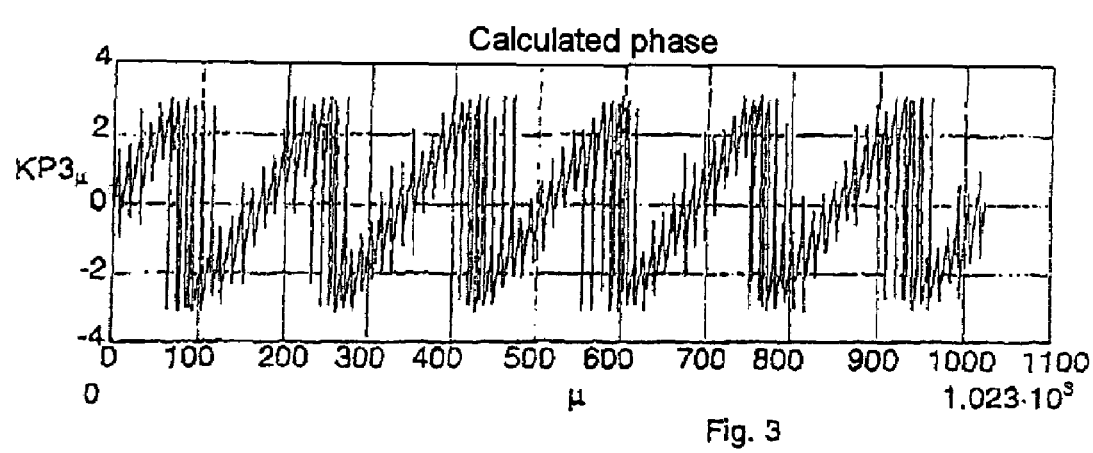
FIG. 3 shows an illustration of a calculated phase profile without an attenuation element.
Figure 4:
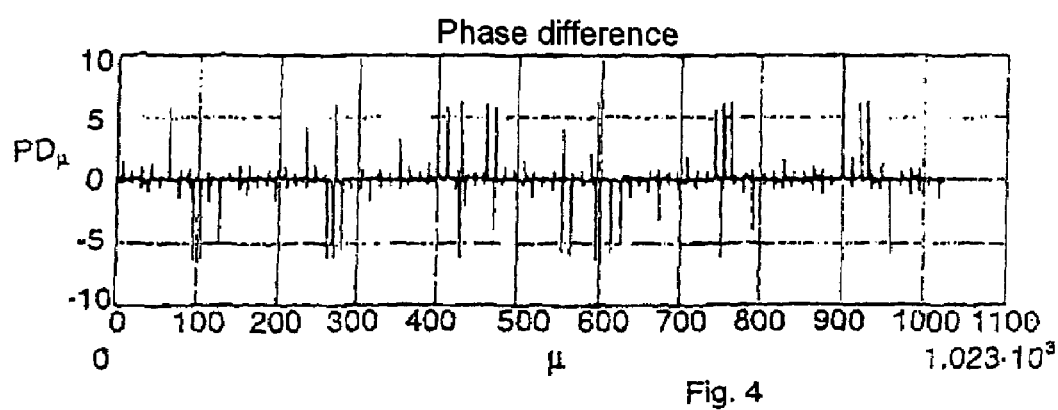
FIG. 4 shows an illustration of the absolute phase error plotted against the frequency without an attenuation element.

The subsequent FIGS. 2 to 4 show the differences between the measured and calculated phase and the error functions without an attenuation element 4. The frequency is in each case plotted in MHz on the abscissa, while the phase is plotted in degrees on the ordinate.

The curve in FIG. 2 is the measured original phase, while the curve in FIG. 3 is the phase as determined by means of a Hilbert transform. FIG. 4 shows the absolute phase error determined between FIGS. 2 and 3, plotted against the frequency. This clearly shows that there is a very large phase error in the calculated values, particularly in the central frequency range.

Figure 5:
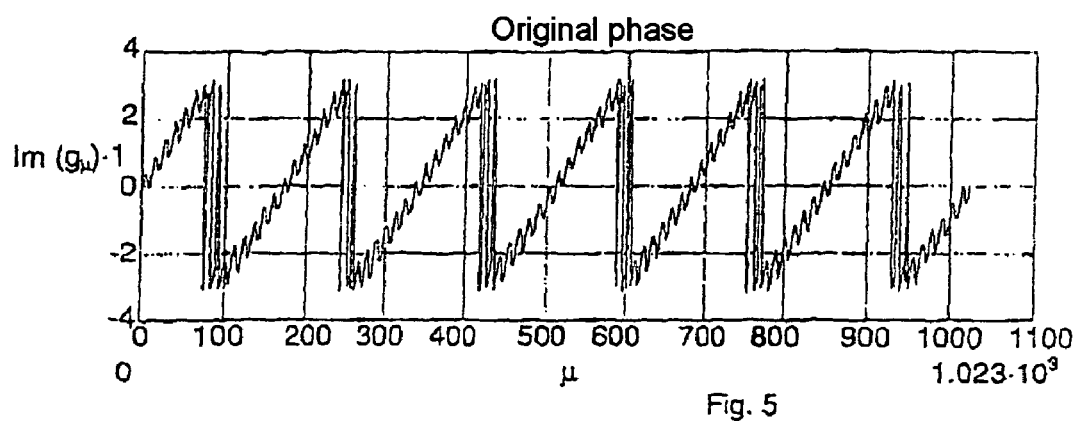
FIG. 5 shows an illustration of a measured phase profile with an attenuation element.
Figure 6:
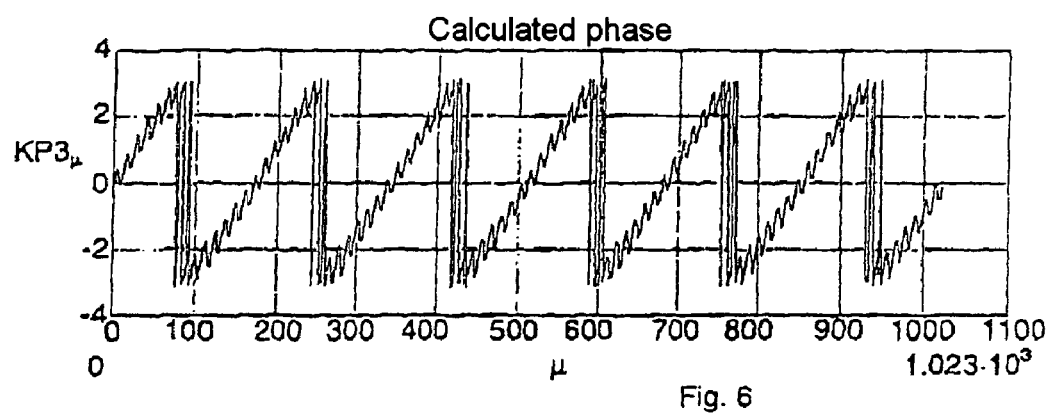
FIG. 6 shows an illustration of a calculated phase profile with an attenuation element.
Figure 7:
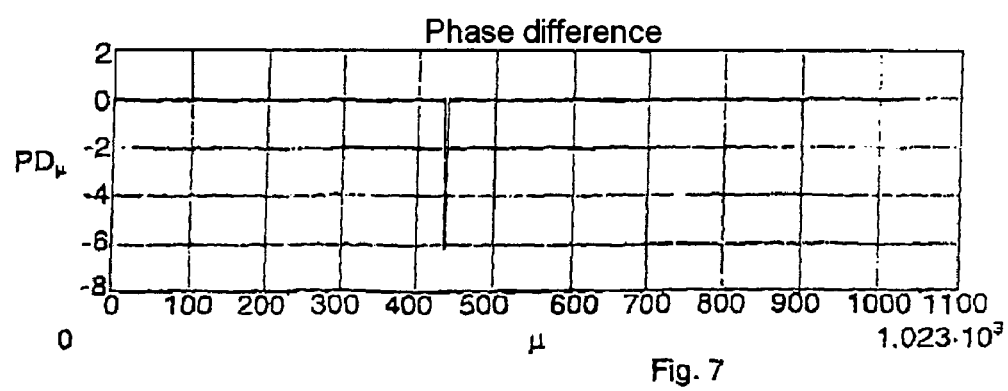
FIG. 7 shows an illustration of the absolute phase error plotted against the frequency with an attenuation element.

In comparison, FIGS. 5 to 7 show the differences between the measured and calculated phase as well as the error functions when using an attenuation element 4 of −6 dB, which was connected between the coupler 3 and the measurement object 5. The intrinsic reflection factor D11 of the attenuation element 4 is 12% in the illustrated example. Once again, the frequency is in each case plotted in MHz on the abscissa, while the phase is plotted in degrees on the ordinate.

As can be seen, the phase curves in FIGS. 5 and 6 are virtually identical, and there is virtually no phase error, due to the influence of the additional attenuation.

FIG. 7 once again shows the absolute phase error plotted against the frequency. This illustration shows that a phase error occurs only in the center of the data record while, in contrast, the phase is calculated incorrectly over the entire range when using the measurement system without an attenuation element 4 as shown in FIGS. 2 to 4.

The invention claimed is:

1. A method for phase calculation from attenuation values by means of a Hilbert transform for FDR measurements, in which a measurement signal is passed via a coupling element (3) to a measurement object (5), and the component which is reflected by the measurement object is output at the coupling element (3) and is measured, characterized in that an attenuation element (4) is connected in the signal path between the coupling element (3) and the measurement object (5).

2. A method for phase calculation from attenuation values by means of a Hilbert transform for FDR measurements, in which a measurement signal is passed via a coupling element (3) to a measurement object (5), and the component which is reflected by the measurement object is output at the coupling element (3) and is measured, characterized in that the coupling element (3) acts as an attenuation element (4).

3. An apparatus for phase calculation from attenuation values by means of a Hilbert transform for FDR measurements, having a signal source (1) for a measurement signal, having a coupling element (3) which is connected to the signal source (1), and having a measurement object which is connected to the coupling element (3), with the measurement signal being passed via the coupling element (3) in the measurement object (5) and the proportion of the measurement signal which is reflected by the measurement object (5) is output via the coupling element (3) and is measured on a sink (2), characterized in that an attenuation element (4) is connected in the signal path between the coupling element (3) and the measurement object (5).

4. An apparatus for phase calculation from attenuation values by means of a Hilbert transform for FDR measurements, having a signal source (1) for a measurement signal, having a coupling element (3) which is connected to the signal source (1), and having a measurement object which is connected to the coupling element (3), with the measurement signal being passed via the coupling element (3) in the measurement object (5) and the proportion of the measurement signal which is reflected by the measurement object (5) is output via the coupling element (3) and is measured on a sink (2), characterized in that an attenuation element (4) is contained in the coupling element (3).

\* \* \* \* \*